United States Patent
Nishikawa

Patent Number: 5,883,521
Date of Patent: *Mar. 16, 1999

[54] GLITCH NOISE PRODUCING SEMICONDUCTOR DEVICE FOR TESTING SEMICONDUCTOR COMPONENTS

[75] Inventor: Masataka Nishikawa, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 516,410

[22] Filed: Aug. 17, 1995

[30] Foreign Application Priority Data

Aug. 26, 1994 [JP] Japan ................................. 6202538

[51] Int. Cl.⁶ .................................................. G01R 31/28
[52] U.S. Cl. .......................... 324/765; 324/763; 365/201
[58] Field of Search ...................... 324/765, 768, 324/769, 763, 719; 371/22.5, 22.6; 365/201

[56] References Cited

U.S. PATENT DOCUMENTS

| | | | |
|---|---|---|---|
| 3,619,780 | 11/1971 | Hoeks et al. | 324/768 |
| 5,170,126 | 12/1992 | Wedge et al. | 324/765 |
| 5,442,642 | 8/1995 | Ingalls et al. | 371/22.5 |
| 5,572,160 | 11/1996 | Wadell | 324/763 |

*Primary Examiner*—Ernest F. Karlsen
*Attorney, Agent, or Firm*—Armstrong, Westerman, Hattori, McLeland & Naughton

[57] ABSTRACT

A semiconductor device capable of giving glitch noise to a test signal used in a noise test for the device. The semiconductor device includes an input circuit for receiving either a test signal supplied from a device tester or a control signal, and an internal circuit connected to the input circuit by a signal line. The internal circuit operates based on a signal provided from the input circuit. The signal line is connected to a noise generator. The noise generator generates glitch noise in a test signal supplied from the tester.

9 Claims, 5 Drawing Sheets

GLITCH NOISE PRODUCING SEMICONDUCTOR DEVICE FOR TESTING SEMICONDUCTOR COMPONENTS

BACKGROUND OF THE INVENTION

1. Field of the Invention

The present invention relates generally to semiconductor devices that respond to test mode signals. In particular, the invention relates to a semiconductor device that produces a glitch noise in response to an externally supplied test signal.

2. Description of the Related Art

One common diagnostic routine used to test the performance of large scale integrated circuits (LSI's) such as semiconductor memory devices, is the so-called glitch "noise" test. This routine makes it possible for LSI manufactures to gauge how a particular device responds to a low frequency interference on glitch noise. During this test, glitch noise is typically input to the LSI during its operation to gauge LSI function in the presence of unwanted interference. The recent increases in LSI operational speeds, however, require increasing shorter glitch noise signals. Consequently, LSI manufacturers are concerned with developing reliable LSI glitch test routines with increasingly shorter glitch noise input.

Noise tests for semiconductor memory devices are conventionally carried out by supplying an address signal containing glitch noise to the semiconductor memory device from a semiconductor testing apparatus, i.e., a tester. Based on a noise testing program, the tester generates an address signal containing glitch noise. To accommodate noise in an address signal, the noise testing program designs an address signal AD0, for example, to have a period $t_w$ for signal level changes as shown in FIG. 1A. When the time period $t_w$ is shortened to time period $t_w0$ as shown in FIG. 1B, a glitch noise GN may be incorporated into the address signal AD0 and output from the tester.

An address decoder circuit in the semiconductor memory receives the address signal AD0 containing the glitch noise and decodes a select signal from the address signal. Based on the select signal, a single memory cell is selected to store either "0" or "1" depending on the testing pattern. When the tester supplies the semiconductor memory device with an address signal having no glitch noise, cell data is read from a memory cell selected based on the address signal. The tester then identifies whether the data read from the cell coincides with data written therein.

Should the programmed time period $t_w$ be too short in duration, however, conventional testers generally cannot generate address signals with glitch noise waveforms like that shown in FIG. 1B. Conventional noise testing is thus limited to testing routines utilizing address signals with sufficiently long $t_w$ period characteristics. In particular, $t_w$ period characteristics must be set longer than that of the noise generated by the tester. This requirement limits the types of testers which can be used for glitch noise testing. In fact, many types of testers are unable to perform glitch noise testing.

A further disadvantage of conventional glitch noise testing is the labor and time it takes to program and operate the tester. Glitch noise testing, consequently, requires a considerable investment in human and financial resources.

SUMMARY OF THE INVENTION

Accordingly, it is a primary objective of the present invention to provide a semiconductor device capable of providing a glitch noise to a test signal input to the semiconductor device from a tester.

To achieve the foregoing and other objects and in accordance with the purpose of the present invention, an improved semiconductor device is provided. As shown in FIG. 2, a semiconductor device according to the present invention includes an input circuit 1 for receiving input signals externally supplied thereto and an internal circuit 2 connected to the input circuit 1 via a signal line 3. The internal circuit 2 operates based on a signal provided from the input circuit 1. A noise generator 4 is connected to the signal line 3. The noise generator 4 generates glitch noise to coincide with a test signal supplied from a tester 5 to the input circuit 1. This obviates the need for the tester 5 to supply test signals containing glitch noises to the semiconductor device.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

A preferred embodiment of the present invention will now be described with reference to FIGS. 3 to 6.

Figure 1A:
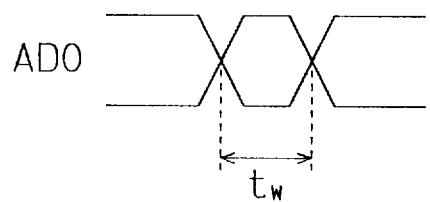
FIGS. 1A and 1B are timing diagrams illustrating the period over which an address signal changes and the introduction of the glitch noise during that period.
Figure 1B:
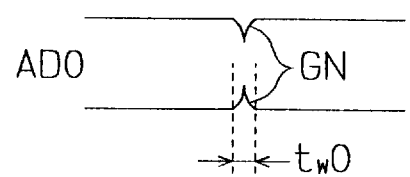
Figure 2:
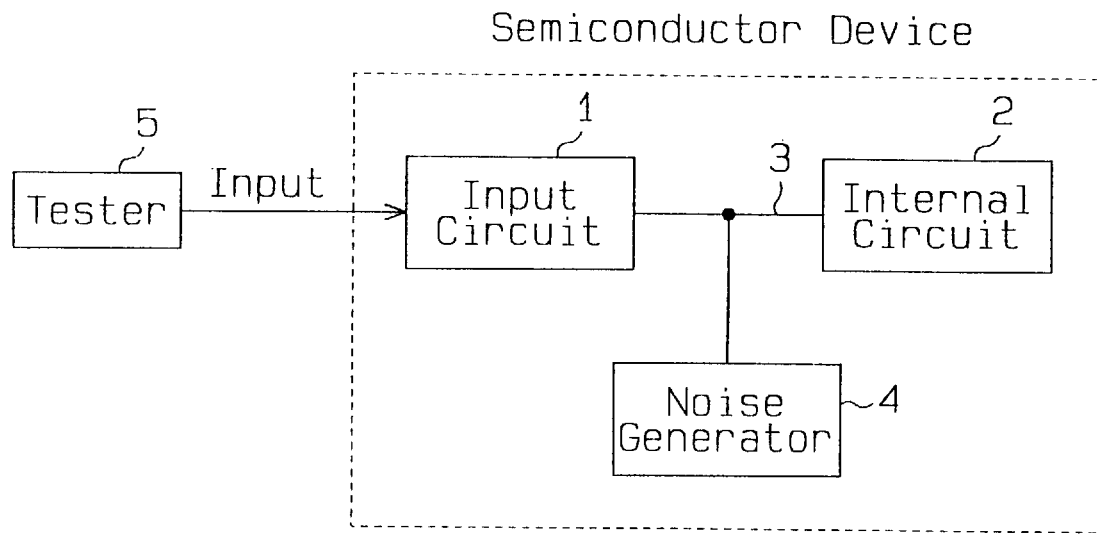
FIG. 2 is a schematic block diagram showing essential parts of a semiconductor device according to the present invention.
Figure 3:
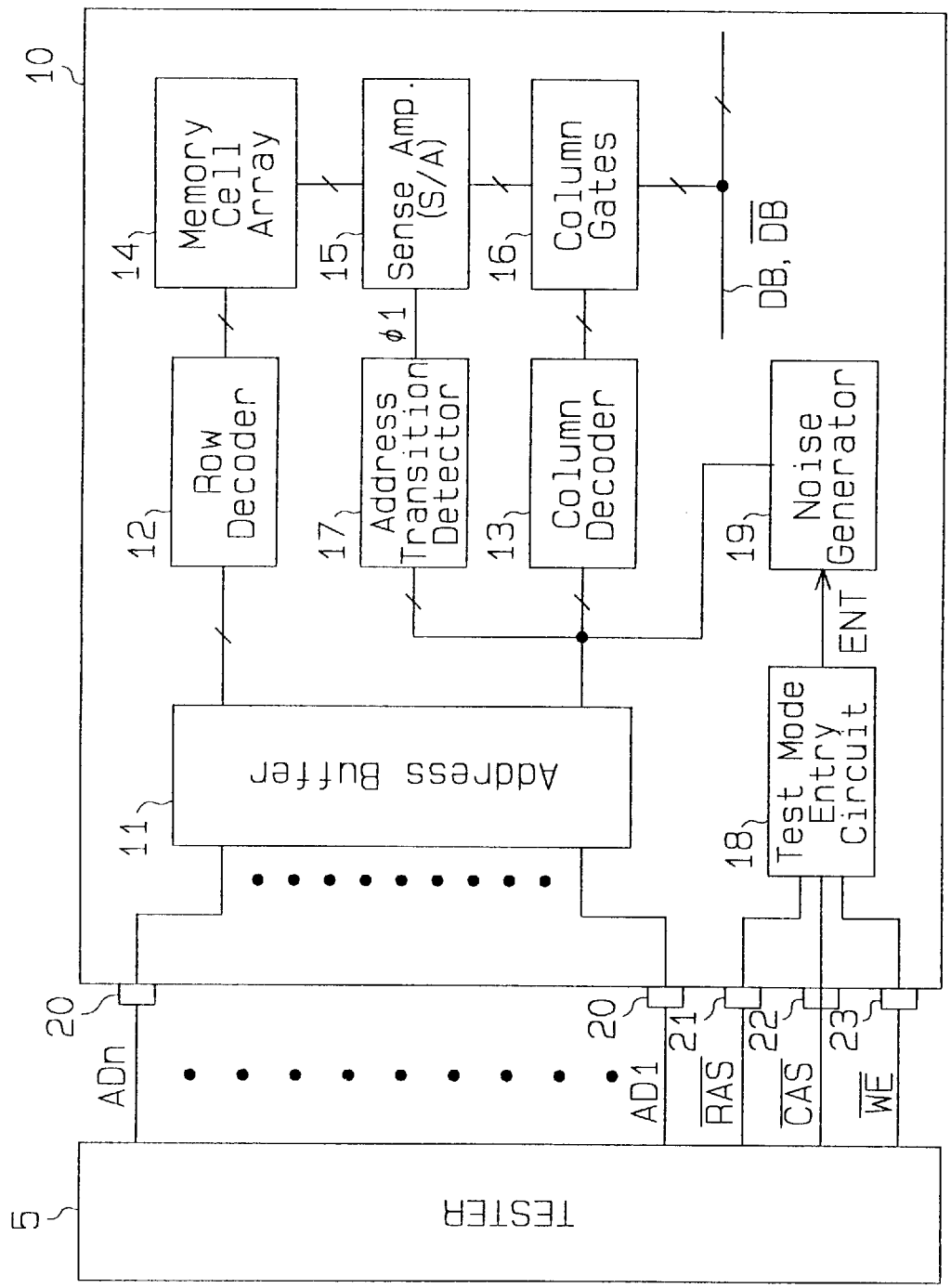
FIG. 3 is a block diagram showing a semiconductor memory device according to an embodiment of the present invention and a tester connected to the memory device.

FIG. 3 is a block diagram of a semiconductor memory chip 10 constructed as a dynamic random access memory (DRAM). The DRAM includes an address buffer 11, a row decoder 12, a column decoder 13, a memory cell array 14, a sense amplifier (S/A) 15, column gates 16, an address transition detector (ATD) 17, a test mode entry circuit 18 and a noise generator 19. In this embodiment, the internal circuit of the semiconductor memory device is formed from the row decoder 12, the column decoder 13, the memory cell array 14, the sense simplifier 15, the column gates 16 and the address transition detector 17. The address buffer 11 serves as the input circuit of the semiconductor device.

A plurality of address terminals 20, formed on the periphery of the chip 10, receive externally supplied address signals AD1 to ADn. Three control terminals 21 to 23 are provided to receive control signals. The control terminal 21 receives a row address strobe signal /RAS, the control terminal 22 receives a column address strobe signal /CAS and the control terminal 23 receives a write enable signal /WE.

The address buffer 11 is connected to the n address terminals 20. The address buffer 11 receives the address signals AD1 to ADn via these address terminals 20 in response to either the row address strobe signal /RAS or the column address strobe signal /CAS. The address buffer 11 generates complementary address signals for output to the row decoder 12, the column decoder 13 and the address transition detector 17, respectively.

Figure 4:
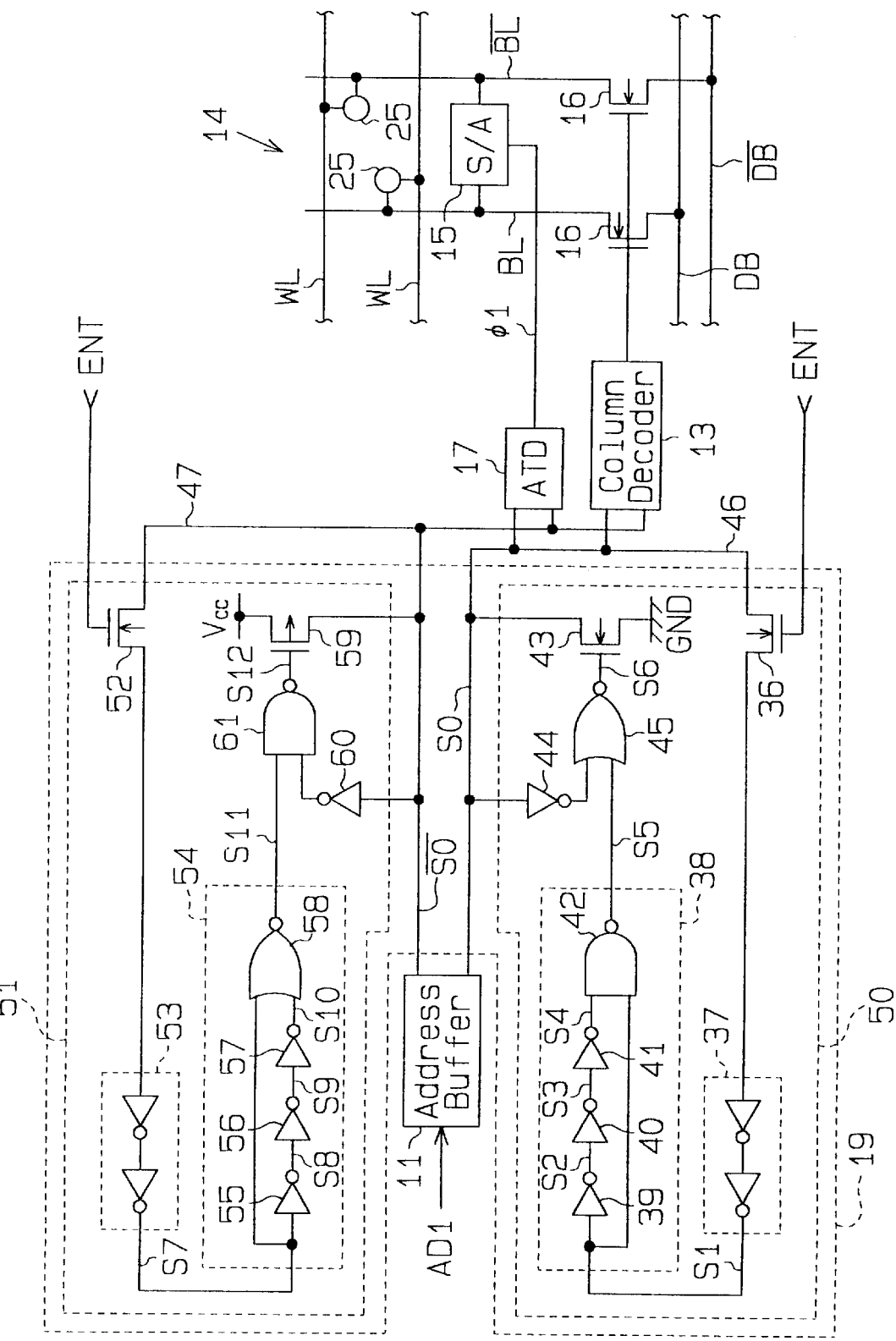
FIG. 4 is a circuit diagram showing detail circuit configuration of a noise generator shown in FIG. 3.

The memory cell array 14 is connected to the sense amplifier 15, which is in turn connected to a pair of data buses DB, /DB via the column gates 16. Specifically, as shown in FIG. 4, the memory cell array 14 is provided with a plurality of word lines WL (only two lines are shown in the Figure) and a plurality of pairs of bit lines BL and /BL (only two lines are shown in the Figure). Memory cells 25 are connected between the respective word lines and bit lines.

The sense amplifier 15, provided between the pair of bit lines BL and /BL, inputs an activating signal $\phi 1$ from the address transition detector 17. The sense amplifier 15 is activated in response to the activating signal $\phi 1$ and amplifies data signals on the bit lines BL and /BL. The complementary bit lines BL and /BL are connected to the data buses DB and /DB via the column gates 16. Each gate 16 is formed with a NMOS transistor. The column gates 16 are connected to the column decoder 13. When a column selection signal from the column decoder 13 goes high, the column gates 16 are turned ON so that complementary data are transferred from the bit lines BL and /BL to the data buses DB and /DB.

The row decoder 12 shown in FIG. 3 decodes input address signals and generates a word line selection signal. A single word line in the memory cell array 14 is selected based on the word line selection signal. The column decoder 13 decodes input address signals, and generates a column selection signal for output to the column gates 16. When a level change occurs in the address signal input to the address transition detector 17, the detector 17 outputs an activating signal $\phi 1$ to the sense amplifier 15.

When a semiconductor memory device undergoes a noise test using the tester 5 as shown in FIG. 3, the tester 5 first generates a row address strobe signal /RAS, a column address strobe signal /CAS and a write enable signal /WE for input to the test mode entry circuit 18. Based on the signals /RAS, /CAS and /WE, the test mode entry circuit 18 generates an entry signal ENT for input to the noise generator 19.

Figure 5:
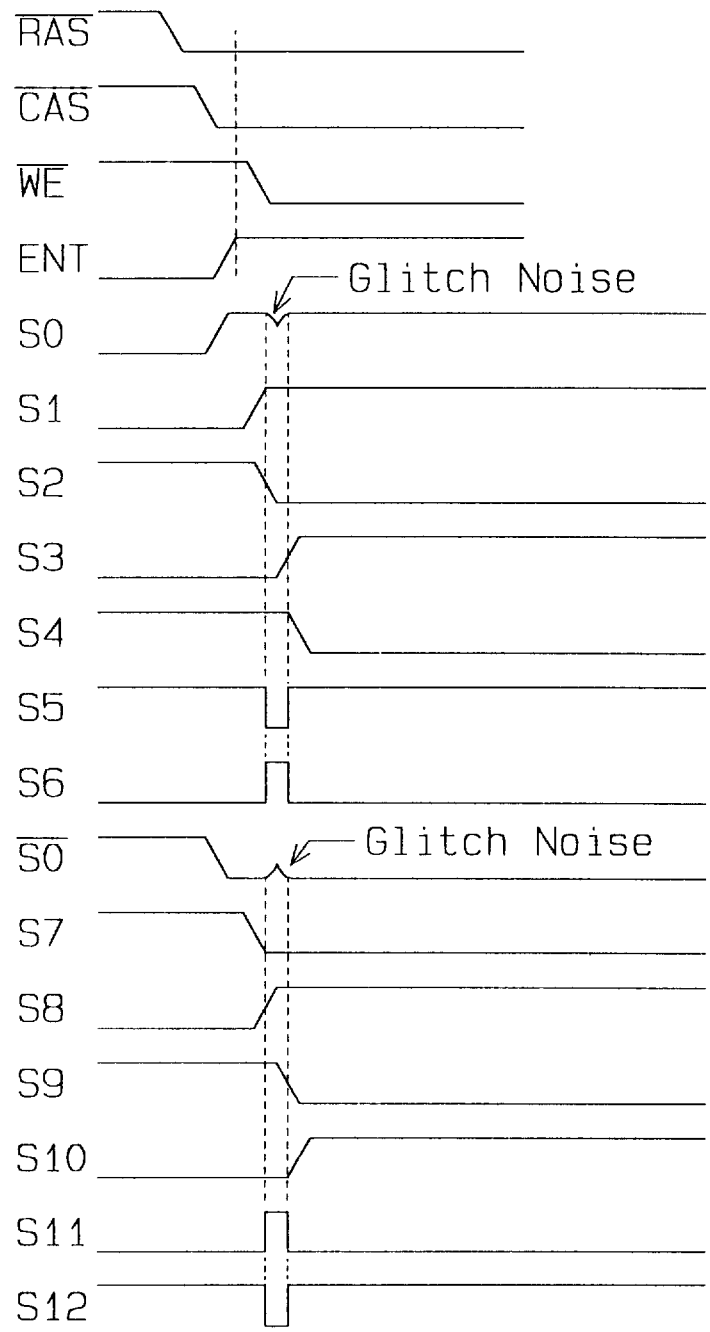
FIG. 5 is a timing chart of the operation of the noise generator shown in FIG. 4.
Figure 6:
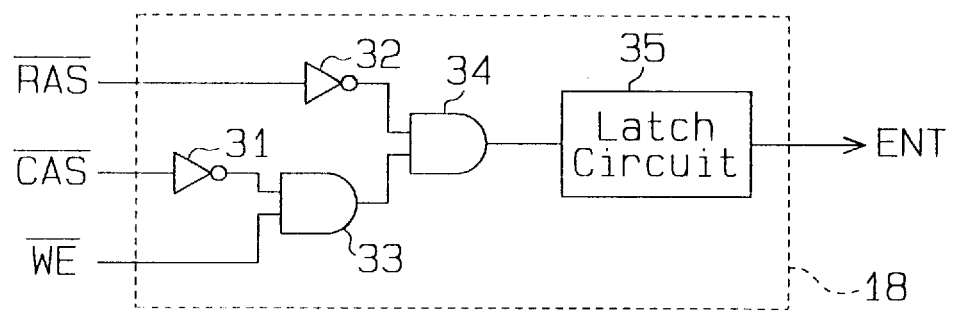
FIG. 6 is a circuit diagram of a test mode entry circuit shown in FIG. 3.

As shown in FIG. 6, the test mode entry circuit 18 is provided with inverters 31 and 32, two input AND gates 33 and 34 and a latch circuit 35. The AND gate 33 receives a write enable signal /WE and the signal CAS which is generated by the inverter 31 from a column address strobe signal /CAS. The AND gate 34 receives an output signal from the preceding AND gate 33 and a row address strobe signal RAS from the inverter 32. The latch circuit 35 latches an output from the AND gate 34 and sends the latched signal as an entry signal ENT to the noise generator 19. Thus, as shown in the timing chart of FIG. 5, when the row address strobe signal /RAS and the column address strobe signal /CAS are set low and the write enable signal /WE is set high, the entry signal ENT goes high.

When a noise test is performed, glitch noise is produced by the noise generator 19, as a component of the signals supplied from the tester 5 to the address buffer 11. The detail circuit configuration of the noise generator 19 is illustrated in FIG. 4. Address signal AD1 input to the address buffer 11 is shown in FIG. 4. In response to the address signal AD1, the address buffer 11 outputs complementary signals S0 and /S0 through signal lines 46 and 47 to the column decoder 13 and the address transition detector 17.

The noise generator 19 is divided into a first circuit 50 for the input signal S0 based on positive logic and a second circuit 51 for the input signal /S0 based on negative logic.

The first circuit 50 includes an NMOS transistor 36 as a gate, a delay circuit 37, a pulse generating circuit 38, a NOR gate 45 as a control circuit and an NMOS transistor 43 as a switching circuit.

The NMOS transistor 36 provides the input signal S0 from the address buffer 11 to the first circuit 50. The entry signal ENT from the test mode entry circuit 18 is input to the gate terminal of the transistor 36. When the entry signal ENT is high, the transistor 36 turns ON to conduct the input signal S0. The delay circuit 37 has two inverters, and is used to delay the input signal S0 switched through the transistor 36. The delayed signal is supplied as a signal S1 to the pulse generating circuit 38.

The pulse generating circuit 38 generates a one-shot pulse in response to the change in potential level of the signal S1. The pulse generating circuit 38 includes a two input NAND gate 42 and an odd number of inverters (three inverters 39, 40 and 41 in this embodiment). The NAND gate 42 has a first input terminal to which the signal S1 is directly input and a second input terminal to which the signal S1 is input via the three inverters 39 to 41.

With the signal S1 low, the output signals S2, S4 and S5 from respective inverters 39, 41 and NAND gate 42 go high, and the output signal S3 from the inverter 40 goes low. When the signal S1 goes high, the output signal S5 from the NAND gate 42 goes low. Once the signal S1 goes high, the levels of the output signals S2, S3 and S4 of the inverters 39, 40 and 41 change after a predetermined period. If the output signal S4 of the inverter 41 goes low, the output signal S5 of the NAND gate 42 goes high. This allows a low level pulse to be output from the NAND gate 42 following the rise of signal S1 high until the signal S4 goes low.

The NOR gate 45 has a first input terminal to which the output signal S5 of the NAND gate 42 is input and a second input terminal to which the signal S0 is input via the inverter 44. The NOR gate 45 generates a signal S6 based on the output from inverter 44 and AND gate 42. With a high signal S0 and a low signal S5, the NOR gate 45 provides the gate of the NMOS transistor 43 with a high level signal S6.

The NMOS transistor 43 is provided between the signal line 46 and the ground GND as a low-potential power supply. The NMOS transistor 43 switches ON in response to the high signal S6 to connect the signal line 46 with the ground GND. In this way, a glitch noise is generated in the signal S0.

The second circuit 51 of the noise generator 19 includes an NMOS transistor 52 as a gate, a delay circuit 53, a pulse generating circuit 54, a NAND gate 61 as a control circuit and a PMOS transistor 59 as a switching circuit.

The NMOS transistor 52 introduces the input signal /S0 from the address buffer 11 to the second circuit 51. An entry signal ENT is input to the gate terminal of the transistor 52. When the entry signal ENT is set high, the transistor 52 is turned ON to gate the input signal/S0 to the delay circuit 53. The dual inverter delay circuit 53 delays transmission of the input signal /S0 to the pulse generating circuit 54.

The pulse generating circuit 54 generates a one-shot pulse in response to a change in potential level of the signal S7. The pulse generating circuit 54 includes a two input NOR gate 58 and an odd number of inverters (three inverters 55, 56 and 57 in this embodiment). The NOR gate 58 has a first input terminal to which the signal S7 is directly input and a second input terminal to which the signal S7 is input by way of the three inverters 55 to 57.

With the signal S7 high, the output signals S8, S10 and S11 from respective inverters 55, 57 and NOR gate 58 go low, and the output signal S9 from the inverter 56 goes high. When the level of the signal S7 changes from high to low, the output signal S11 from the NOR gate 58 goes high. When signal S7 goes low, the levels of the output signals S8, S9 and S10 of the inverters 55, 56 and 57 change after a predetermined delay. If the signal S10 of the inverter 57 goes high, the output signal S11 of the NOR gate 58 goes low. Thus, a high one-shot pulse is output from the NOR gate 58 during the time period from when the signal S7 goes low to when the signal S10 goes high.

A first input terminal of the NAND gate 61 receives the output signal S11 from the NOR gate 58. A second input terminal of the gate 61 receives the signal /S0 from an inverter 60. Based on signals S11 and /S0, the NAND gate 61 generates a signal S12. With a low input signal /S0 and a high output signal S11, the NAND gate 61 provides a low signal S12 to the gate of the PMOS transistor 59.

The PMOS transistor 59 is provided between the signal line 47 and a high potential power supply $V_{CC}$. The PMOS transistor 59 switches ON in response to a low signal S12 to connect the signal line 47 to the high potential power supply $V_{CC}$. Glitch noise is thereby generated on the input signal /S0.

The noise testing operation of the DRAM chip 10 according to the present embodiment will now be described with reference to FIGS. 3 and 5.

As shown in FIG. 3, to test the semiconductor chip 10 for its response to noise, the chip 10 is connected to the tester 5. During testing, data is written in the memory cell array 14 as write data, read from the memory cell array 14 as read data, and then the read data is compared with the write data. In particular, the tester 5 supplies the chip 10 with a row address strobe signal /RAS, a column address strobe signal /CAS, a write enable signal /WE and address signals AD1 to ADn.

As shown in FIG. 5, when the row address strobe signal /RAS and the column address strobe signal /CAS are set low and when the write enable signal /WE is set high, the outputs of the AND gates 33 and 34 in the test mode entry circuit 18 go high and the latch circuit 35 latches the entry signal ENT high.

When the address signals AD1 to ADn are supplied to the address buffer 11, the address buffer 11 generates the complements of the individual address signals AD1 to ADn. The complementary signals are supplied to the row decoder 12, the column decoder 13 and the address transition detector 17. The row decoder 12 decodes the supplied complementary address signals in order to generate a word select signal for selecting one of the word lines in the memory cell array 14. The column decoder 13 takes the complementary address signals, and generates a column select signal. The column select signal, supplied to any one pair of the column gates 16, allows the bit lines associated with the column gates to be selected. Data is written, by a write amplifier (not shown), into the memory cell 25 connected to the selected word line and bit line pair.

Complementary signals S0 and /S0, originated from the address signal AD1, are supplied to the column decoder 13 and the address transition detector 17 via the signal lines 46 and 47. A rise in the address signal AD1 occasions a rise in the signal S0 and a fall in the signal /S0.

The NMOS transistor 36 in the first circuit 50 switches ON in response to a high level entry signal ENT, and provides the input signal S0 to the first circuit 50. The input signal S0, delayed by the delay circuit 37, is supplied to the pulse generating circuit 38 as signal S1. In response to the rising signal S1, the pulse generating circuit 38 generates a one-shot low level signal S5.

When the signal S0 is set high, the output signal S6 of the NOR gate 45 goes high in response to the low single shot pulse signal S5. The NMOS transistor 43 then temporarily turns ON, grounding the signal line 46. Consequently, the potential of the signal S0 rapidly falls low, causing a glitch to be generated in the signal S0.

In the second circuit 51, the NMOS transistor 52 switches ON in response to a high level entry signal ENT. This allows the input signal /S0 to be fed to the second circuit 51. After being delayed by the delay circuit 53, the input signal is provided to the pulse generating circuit 54 as signal S7. When the signal S7 falls low, the pulse generating circuit 54 outputs a high single shot pulse S11.

When the input signal /S0 falls low, the output signal S12 of the NAND gate 61 also goes low in response to the high single shot pulse signal S11. The PMOS transistor 59 then temporally turns ON, connecting the signal line 47 to the high potential power supply $V_{CC}$. Consequently, the potential of the input signal /S0 rapidly rises, causing a glitch to be generated in the signal /S0. If the glitch in the input signals S0 and /S0 prevents proper bit line selection, data will be written to the wrong memory cell.

Next, the tester 5 changes the signal potential level of either the row address strobe signal /RAS, the column address strobe signal /CAS or the write enable signal /WE in order to set the entry signal ENT low. The tester 5 also supplies the chip 10 with the address signals AD1 to ADn, as they were at the time data was written to the memory cell.

When the NMOS transistors 36 and 52 are turned OFF by the low entry signal ENT, the input signals S0 and /S0 are not supplied to the first and second circuits 50 and 51. This prevents glitch noises from being generated in the input signals S0 and /S0.

Based on the signals generated by the address buffer 11, the row decoder 12 and the column decoder 13 generate a word line selection signal and a column selection signal, respectively. One of the memory cells 25 in the memory cell array 14 is selected and cell data is read to the pair of bit lines BL and /BL from the selected cell. The address transition detector 17 then outputs a signal $\phi 1$ in response to a change in the potential level of the input address signal, activating the sense amplifier 15. The data signals on the bit lines BL and /BL are consequently amplified by the sense amplifier 15, and are output to data buses DB and /DB via the column gates 16.

The tester 5 next compares the write data written in the DRAM chip 10 with the read data read from the chip 10. From this comparison, the tester 5 can determine whether the row and column decoders 12 and 13 are functioning properly in the presence of glitch noise. If the data written to the memory cell array matches the data read from the memory cell array, then the tester concludes that the row and column decoders 12 and 13 are functioning properly despite the presence of glitch noise.

To test the address transition detector 17 for its response to glitch noise, the tester 5 outputs signals /RAS, /CAS and /WE to the test mode entry circuit 18. The potentials of the these signals are such to cause the circuit 18 to generate a low entry signal ENT. The tester 5 then supplies the address signals AD1 through ADn to the DRAM chip 10.

Based on the signals output from the address buffer 11, the row decoder 12 generates a word line selection signal to select one of the word lines of the memory cell array 14. The column decoder 13 then generates a column selection signal to select any one pair of bit lines. Data is written, by a write amplifier (not shown), in the memory cell 25 connected to the selected word line and bit line pair.

During the time that the entry signal ENT is low, the NMOS transistors 36 and 52 are kept OFF, ensuring that the first and second circuits 50 and 51 are not supplied with complementary signals S0 and /S0. This prevents glitch noise from effecting the signals S0 and /S0.

The tester 5 then changes the level of the signals /RAS, /CAS or /WE to set the entry signal ENT high, and supplies the chip 10 with the same address signals AD1 to ADn used in the data writing operation described above. In the same manner as described above, one memory cell 25 is selected based on the complementary signals generated by the address buffer 11. Cell data is then read to a pair of bit lines BL and /BL from the selected memory cell. At this time, the address transition detector 17 generates an activating signal φ1 in response to a change in the potential level of the input address signal. This activates the sense amplifier 15. The sense amplifier 15 in turn amplifies data signals on the bit lines BL and /BL. Once amplified, the data signals are provided to the data buses DB and /DB via the column gates 16.

The NMOS transistor 36 turns ON in response to a high level entry signal ENT causing the input signal S0 to be supplied to the first circuit 50. The NOR gate 45 produces a high single shot pulse signal S6 in response to a rising signal S1. The NMOS transistor 43 turns ON in response to the high level pulse signal S6, grounding the signal line 46. As a result, a potential degrading glitch noise is generated in the input signal S0.

The activation of the NMOS transistor 52 in response to the high level entry signal ENT, allows the second circuit 51 to be supplied with the input signal /S0. The NAND gate 61 outputs a single shot pulse signal S12 low in response to a change of the signal S7 from high to low. The PMOS transistor 59 turns ON in response to the low pulse signal S12, connecting the signal line 47 to the high potential power supply $V_{CC}$. As a result, a potential enhancing glitch noise is generated in the input signal /S0.

If the address transition detector 17 cannot output an activating signal φ1 due to the glitch noise generated in the input signals S0 and /S0, the sense amplifier 15 will remain inactivated, making it impossible to read data from the memory cells. The tester 5 can acquire noise test results for the address transition detector 17 by comparing data read from the DRAM chip 10 to that of previously written data. When the read data matches the write data, the tester 5 determines that the address transition detector 17 is functioning properly despite the presence of glitch noise.

As described above, the semiconductor device of the present embodiment incorporates a noise generator 19 that generates glitch noise in the signals S0 and /S0. This allows noise testing of component circuitry without the need of a tester 5 to supply a glitch noise signal to the semiconductor device. In particular, this makes it possible to execute noise effect tests for the row decoder 12, the column decoder 13 and the address transition detector 17, based on normal address signals. This makes the use of expensive high performance testers unnecessary, and simplifies the overall noise testing routine. A further advantage of the present invention is that it greatly reduces the time and expense necessary for programmers to prepare noise test programs.

Although only one embodiment of the present invention has been described herein, it should be apparent to those skilled in the art that the present invention may be embodied in many other specific forms without departing from the spirit or the scope of the invention. Particularly, it should be understood that the following modifications may be employed.

The delay circuit 37 shown in FIG. 4 may be provided between the pulse generating circuit 38 and the NOR gate 45. Such a construction would allow glitch noise to be imposed on an input signal S0 after the potential level of the input signal S0 changes. That is, glitch noise could be imposed on the signal S0 after a delay based on the change in input signal S0.

In the DRAM in the above described embodiment, a plurality of noise generators 19 may be provided, in order to impose noise on two or more address signals.

Each of the MOS transistors 43 and 59 shown in FIG. 4 may be replaced with a bipolar transistor or a transmission gate formed of a pair of PMOS and NMOS transistors.

In a semiconductor memory device other than a DRAM or in a semiconductor device other than a semiconductor memory, a noise generating circuit according to the present invention may be provided for the purpose of noise tolerance test for the device.

Therefore, the present examples and embodiments are to be considered as illustrative and not restrictive, and the invention is not to be limited to the details given herein, but may be modified within the scope of the appended claims.

What is claimed is:

1. A semiconductor device capable of generating a noise signal for use with a test signal, to test the function of the semiconductor device, said semiconductor device comprising:

an input circuit for receiving said test signal;

a circuit formed in said semiconductor device and connected to said input circuit via a signal line, for operating in response to said test signal; and a noise generator, connected to said signal line, for generating glitch noise forming a component of said test signal.

2. The semiconductor device according to claim 1 further comprising:

a test mode entry circuit responsive to a control signal supplied from a device tester, for generating an entry signal to operate said noise generator.

3. The semiconductor device according to claim 2, wherein said noise generator imposes glitch noise on the test signal input to said input circuit, in response to a change in level of the input test signal.

4. The semiconductor device according to claim 2, wherein said noise generator includes a gate circuit responsive to the entry signal, for allowing the test signal to be input to said noise generator.

5. The semiconductor device according to claim 2, wherein said noise generator includes:

a gate circuit responsive to the entry signal, for allowing the test signal to be input from said input circuit to said noise generator;

a pulse generating circuit coupled to said gate circuit, for generating a single shot pulse signal in response to a change in level of said test signal; and a switching circuit provided between said signal line and a low potential power supply, for generating glitch noise on said signal line, said switching circuit being responsive to the single shot pulse signal for controlling electrical connection between said signal line and the power supply.

6. The semiconductor device according to claim 5, wherein said noise generator further includes a delay circuit provided between said gate circuit and said pulse generating circuit, for supplying said pulse generating circuit with the input test signal after a predetermined delay.

7. The semiconductor device according to claim 5, wherein said noise generator further includes a control gate provided between said switching circuit and said pulse generating circuit, said control gate having two input terminals receiving the input test signal and the single shot pulse signal, wherein said control circuit turns said switching circuit ON in response to the single shot pulse signal when the input test signal has a potential level at which said pulse generating circuit is allowed to output a single shot pulse signal.

8. The semiconductor device according to claim 6, wherein said noise generator further includes a control gate provided between said switching circuit and said pulse generating circuit, said control gate having two input terminals receiving the input test signal and the single shot pulse signal, wherein said control circuit turns said switching circuit ON in response to the single shot pulse signal when the input test signal has a potential level at which said pulse generating circuit is allowed to output a single shot pulse signal.

9. The semiconductor device according to claim 1,
wherein said input circuit includes an address buffer for receiving an address signal as test signal, and
wherein said internal circuit includes:
 a memory cell array having a plurality of memory cells provided between a plurality of word lines and a plurality of bit lines;
 a decoders for decoding the address signal supplied from said address buffer to generate a select signal for selecting one of the memory cells;
 a sense amplifier for amplifying a data signal read from the memory cell selected by said decoder; and
 an address transition detector for activating said sense amplifier in response to a change in level of the address signal.

* * * * *